United States Patent
Söderbärg et al.

(10) Patent No.: US 6,300,173 B1
(45) Date of Patent: Oct. 9, 2001

(54) METHOD AND DEVICE RELATING TO SEMICONDUCTOR COMPONENTS

(75) Inventors: Anders Söderbärg, Uppsala; Nils Ögren, Vällingby; Håkan Sjödin, Knivsta; Ivar Hamberg, Stockholm, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/236,001

(22) Filed: Jan. 22, 1999

Related U.S. Application Data

(62) Division of application No. 09/045,636, filed on Mar. 23, 1998, now Pat. No. 6,121,668.

(30) Foreign Application Priority Data

Mar. 27, 1997 (SE) .................................. 9701156

(51) Int. Cl.⁷ .................................................. H01L 21/00
(52) U.S. Cl. .................. 438/151; 438/152; 438/355; 438/405
(58) Field of Search ............................. 438/151, 152, 438/355, 405

(56) References Cited

U.S. PATENT DOCUMENTS

| | | |
|---|---|---|
| 5,070,388 | * 12/1991 | Wade et al. .......................... 357/78 |
| 5,373,183 | 12/1994 | Beasom . |
| 5,449,946 | 9/1995 | Sakadibara et al. . |
| 5,561,503 | * 10/1996 | Schrantz et al. ..................... 257/77 |
| 6,008,512 | * 12/1999 | Beasom ............................... 257/248 |

FOREIGN PATENT DOCUMENTS

| | | |
|---|---|---|
| 0 596 264 | 5/1994 | (EP) . |
| 0 628 996 | 12/1994 | (EP) . |

OTHER PUBLICATIONS

Christoleveanu S. et al., "Electrical Characterization of Silicon–On–Insular Materials and Devices", Kluwer Academic Publishers, Mass. USA, Chapter 2, pp. 7–44.

Sze, S.M., "VLSI Techology–2nd Edition", 1988, McGraw–Hill Book Company, New York, USA pp. 45–56.

* cited by examiner

*Primary Examiner*—Michael Lebentritt
(74) *Attorney, Agent, or Firm*—Burns, Doane, Swecker & Mathis, L.L.P.

(57) ABSTRACT

A conductor 1 crossing a trench around an electrical component 1 is electrically connected to an isolated intermediate conducting region in order to move the field strength concentrations out of the electrical component and into the intermediate conducting region. This prevents avalanche breakdown occurring in the electrical component.

13 Claims, 4 Drawing Sheets

METHOD AND DEVICE RELATING TO SEMICONDUCTOR COMPONENTS

This application is a divisional of application Ser. No. 09/045,636, filed Mar. 23, 1998, now U.S. Pat. No. 6,121,668.

BACKGROUND

The present invention relates to a method and device for reducing electric field concentrations in electrical components.

In order to completely isolate components in integrated circuit from each other trench techniques may be used in a silicon-on-insulator (SOI) material. The SOI material which the component is to be formed on may consist of a thin layer of silicon on an insulating material. The component is completely isolated from the surroundings by a trench being etched down to the isolating substrate around the circumference of the component to be isolated. An isolating material, which can differ from that of the insulating substrate, is then deposited in the trench. This leaves components in the form of an island of silicon surrounded by insulating materials—laterally by the filled trench of isolating material and vertically by the insulating substrate The insulating substrate and the trench isolating material could be, for example, silicon oxide, silicon nitride, sapphire, aluminium oxide or the like. Trench techniques and SOI technology are know from SZE, S.M., "VLSI Technology—2nd edition" 1988, McGraw-Hill Book Company, New York, USA and from SORIN CRISTOLOVEANU and SHENG SLI "Electrical Characterisation of Silicon-On-Insulator Materials and Devices" 1995, Kiuwer Academic Publishers, Massachusetts, USA.

This technique can be used to isolate high voltage components. However problems can occur owing to the electric field being concentrated at the sharp corner region of the active component. This electric-field concentration reduces the avalanche breakdown voltage of the corner region and this part of the device turns on at a lower voltage than the interior portion of the device. This problem is exacerbated in the case that a conductor with a high-voltage crosses the trench. This can lead to a lower than expected avalanche breakdown where the high-voltage conductor crosses the regions in which the electric-field concentration is highest.

SUMMARY

The present invention solves the problem of how to reduce the occurrence of avalanche breakdown where a high-voltage conductor crosses a region having a high electric-field concentration.

The problem is solved by means of an intermediate conducting region which is used to move The high electric-field concentrations out of a component to be protected.

The components produced according to the invention have an increased resistance to avalanche breakdown where a conductor crosses a trench which means that the distance between components and conductors can be reduced or the component can handle a higher voltage.

BRIEF DESCRIPTION OF THE DRAWINGS

The invention will be described in more detail below by means of an example of an embodiment of the invention which is illustrated in the figures where.

DETAILED DESCRIPTION

Figure 1A:
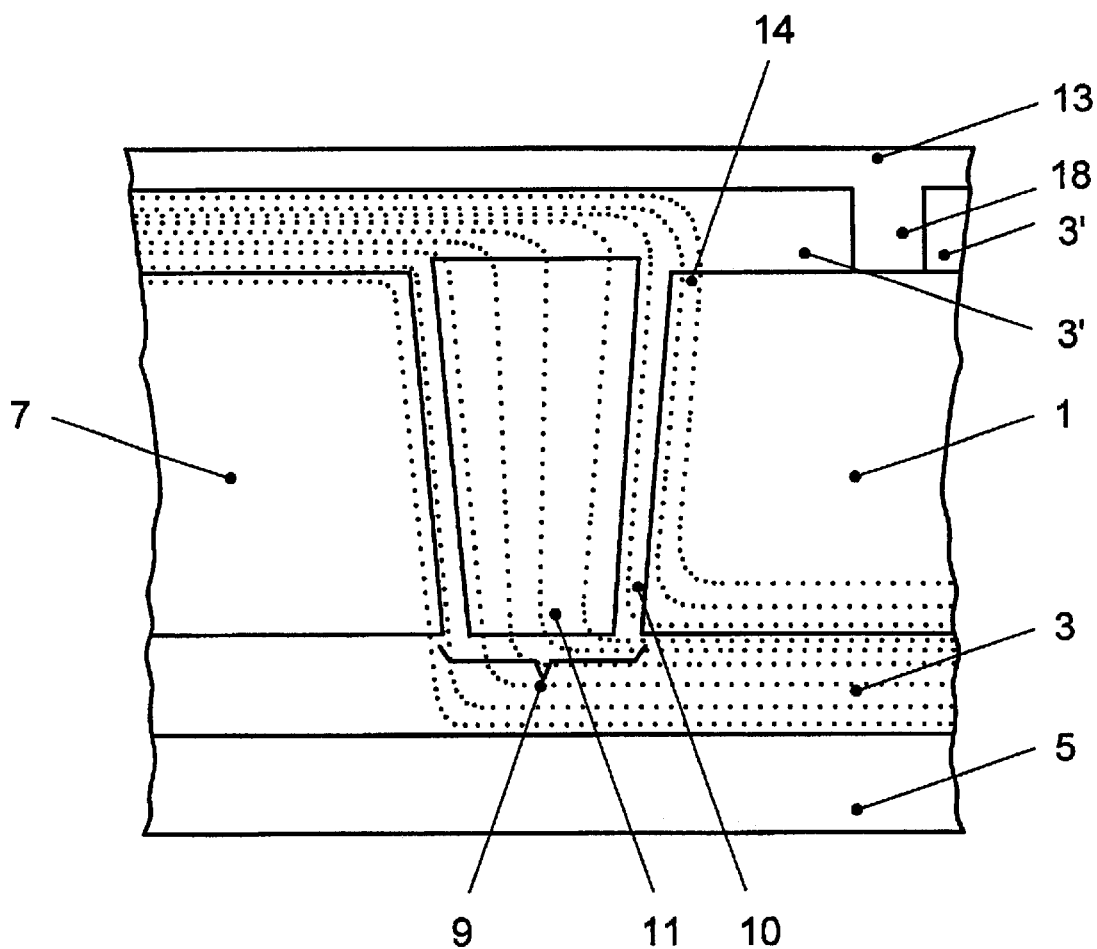
FIG. 1a shows a section through line I—I of the component in FIG. 1b.
Figure 1B:
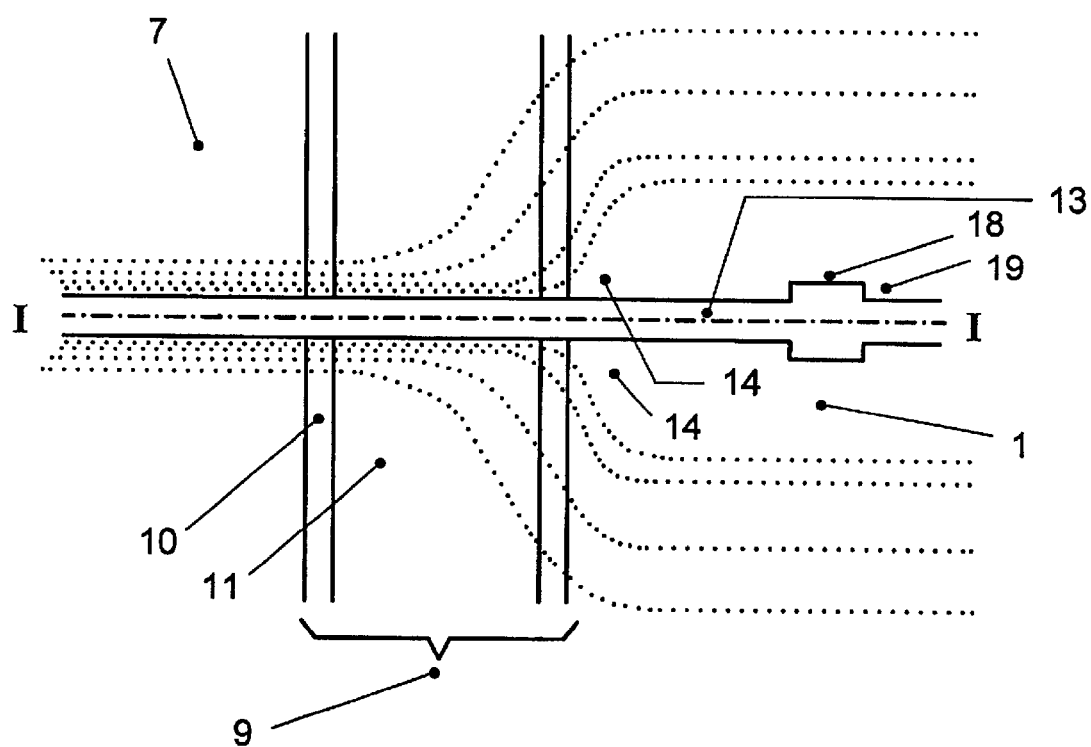
FIG. 1b shows a plan view of iso-potentials in a prior art component.

FIGS. 1a and 1b show a component 1 in the form of a semiconducting island 1 of, for example, silicon, which has been produced on a buried isolator 3 which has been formed on: a substrate 5. Component 1 is separated from the surrounding silicon 7 by means of a trench 9 which is filled with isolating material, for example, silicon oxide 10 and polycrystalline silicon 11. A conductor 13 with a high-potential is formed on the part of an isolator 3' which is formed above component 1, surrounding silicon 7 and trench 9. Conductor 13 crosses trench 9 and passes over high-voltage component 1. Conductor 13 is connected to component 1 by means of a contact 18. Contact 18 can be connected to, for example, the anode (if component 1 is a diode) or collector or drain 19 (if component 1 is a transistor) of component 1. Thus a part 19 of component 1 is at a higher potential than surrounding silicon 7 and trench 9. An example of how the iso-potential lines in the high-voltage component 1 could be are shown by dotted lines. The exact distribution of the isopotential lines naturally depends on the state of the component and vary with its activity. The closer together the iso-potential lines are the greater is the concentration of the electrical field in the material and the easier it is for an avalanche breakdown to occur. It can be seen from the figures that the greatest risk for avalanche breakdown is at the corner 14 of high-voltage component 1 which is nearest to where conductor 13 crosses trench 9. The concentration of the electrical field inside component 1 is highest in comer 14. Avalanche breakdown is undesirable as it affects the function of any component experiencing it.

Figure 2A:
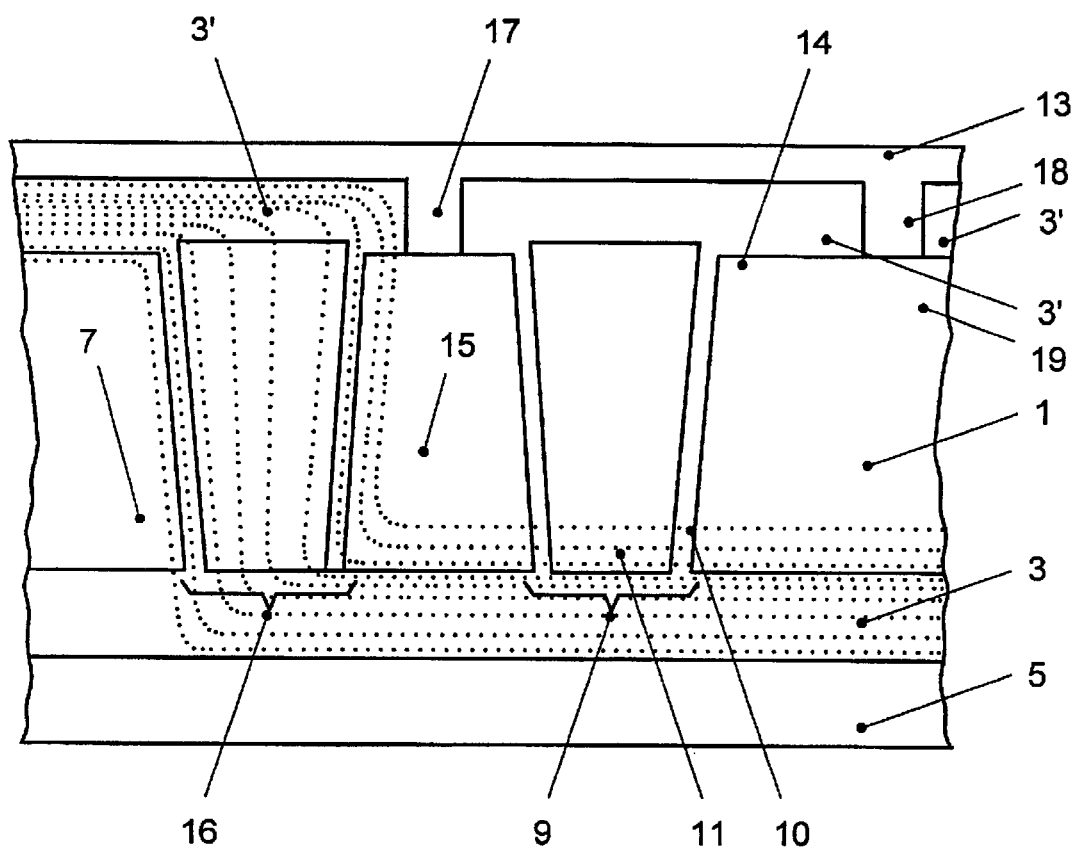
FIG. 2a shows a section through line II—II of the component in FIG. 2b.
Figure 2B:
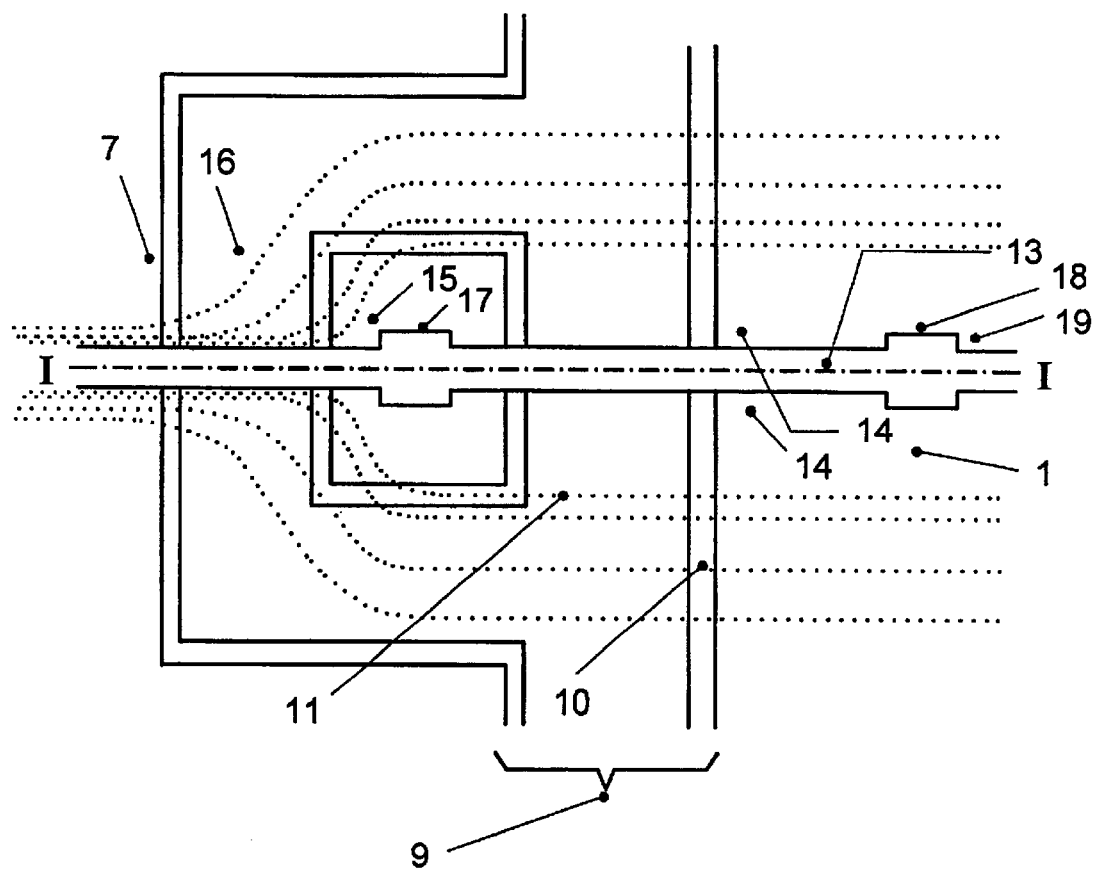
FIG. 2b shows a plan view of iso-potentials in a component constructed according to the invention.

FIGS. 2a and 2b show a similar component provided with avalanche breakdown preventing means according to the present invention. An intermediate conducting region in the form of an island of silicon 15 has been surrounded by a non-conducting trench structure 16 produced in any conventional way. Island 15 is connected to conductor 13 by means of a contact 17. As above conductor 13 is connected to component 1 by means of a contact 18. Contact 18 can be connected to, for example, the anode (if component 1 is a diode) or collector or drain 19 (if component 1 is a transistor) of component 1. Thus a part 19 of component 1 is at a higher potential than surrounding silicon 7 and trench 9.

However, as can be seen by the dotted lines the peak concentrations of the iso-potential lines no longer occur in the component 1 but are in island 15. Hence component 1 can for example work at higher potentials with a reduced risk of avalanche breakdown at comer 14 in the active component. If avalanche breakdown occurs then it will take place in island 15 which preferably does not contain an active component. Thus avalanche breakdown will not affect the functioning of component 1.

The optimum size of island 15 depends, amongst others, on the potential difference between the conductor 13 and the adjacent conducting region 7 and components 1, the size of the conductor and the thickness and material of the insulation 3'. In order to save space on the constituent wafer the island 15 should preferably be as small as possible and hence should have a surface area considerably less than that normally used for constructing an electrical component 1. It should be at least less than one half of the size of the component 1 that it is protecting and is preferably less than one tenth the size. In order to enclose the field-concentrations it should be at least as wide as the overlying conductor 13. Preferably the suitable maximum side lengths or diameters for such islands which are attached to a single conductor is in the range of 1–100 ⌒m. It is naturally possible that for manufacturing reasons, it would be preferable to form the island 15 as an elongated rectangle between two parallel trenches 9, 16 which run along substantially the whole length of one or more sides of a component 1. In this case the above given maximum size for the length of a side may need to be surpassed. In order to save space the island 15 preferably should not extend around the whole of the circumference of the component 1 but should be limited to regions underlying conductor(s) 13.

It is conceivable that an island 15 can be formed so as to be connected to two or more conductors in which case the maximum dimension of the island may be much more than 100 ⌒m. However it is still preferable that its width be in the above mentioned ranges of size. In this case the conductors should have approximately the same electrical potential to reduce the risk for avalanche breakdown in the island 15. Preferably any difference in electrical potential should be less than 10 V.

Although it is possible to conceive an arrangement where the island 15 is formed as a functional electrical component such as a resistor, capacitor, diode or transistor, in the preferred arrangement island 15 is inactive, that is, it has no function other than to displace the field strength concentrations away from a nearby component. If island 15 is a functional electrical component then it should be less sensitive to avalanche breakdown than component 1.

Although shown as a rectangular island in the embodiment above, any suitable shape of island 15 could be used in a device according to the invention. The isolating material around the structures mentioned above can be any suitable material or combinations of materials. Suitable materials include doped or undoped amorphous or poly-crystalline silicon, silicon dioxide and/or nitride and/or any other insulating material.

Furthermore the invention is not restricted to use with components produced on a buried isolator but may be adapted for use with any electrical components.

The examples of embodiments of the invention described above relate to electrical devices using silicon as the semiconductor material but are equally applicable to devices using other semiconductor materials.

What is claimed is:

1. A method of reducing field-strength concentrations in an electrical component, comprising the steps of:

forming a first isolating region between a conducting region and the electrical component;

electrically connecting the conducting region to a contact on the electrical component; and forming an intermediate conducting region between the conducting region and the electrical component, the intermediate conducting region being separated from the conducting region by a second isolating region, the intermediate conducting region being separated from the electrical component by the first isolating region, the intermediate conducting region being electrically connected to the conductor, wherein the intermediate conduction region and the second isolating region form an arrangement for preventing avalanche breakdown in the electrical component.

2. The method of claim 1, wherein the electrical component is a semiconductor component.

3. The method of claim 1, wherein the electrical component comprises a layer of semiconductor on a buried isolator which has been formed on a semiconductor substrate.

4. The method of claim 1, wherein the intermediate conducting region is formed as a layer of semiconductor material on a buried isolator which has been formed on a semiconductor substrate.

5. The method of claim 1, wherein the second isolating is produced as an isolating trench.

6. The method of claim 5, wherein the isolating trench comprises material selected from a group comprised of doped or undoped amorphous or poly-crystalline silicon, silicon dioxide, nitride, and any other insulating material.

7. The method of claim 2, wherein the semiconductor component is made of silicon.

8. The method of claim 1, wherein the intermediate conducting region is formed as an inactive region which does not comprise an active device.

9. The method of claim 1, wherein a surface area of the intermediate conducting region is less than half of a surface area of the electrical component.

10. The method of claim 1, wherein a surface area of the intermediate conducting region is less than one tenth of a surface area of the electrical component.

11. The method of claim 1, wherein the intermediate conducting region is formed in electrical contact with a single conductor.

12. The method of claim 1, wherein the intermediate conducting region is formed in electrical contact with a plurality of conductors.

13. The method of claim 12, wherein the plurality of conductors are formed with a connection to substantially the same potential.

* * * * *